US012782469B2

(12) United States Patent
Cesaretti et al.

(10) Patent No.: US 12,782,469 B2
(45) Date of Patent: Nov. 3, 2026

(54) MAGNETIC FIELD SENSORS WITH CURRENT MODE OFFSET AVERAGING

(71) Applicant: Allegro MicroSystems, LLC, Manchester, NH (US)

(72) Inventors: Juan Manuel Cesaretti, Buenos Aires (AR); Ezequiel Rubinsztain, Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 135 days.

(21) Appl. No.: 18/635,097

(22) Filed: Apr. 15, 2024

(65) Prior Publication Data

US 2025/0321299 A1 Oct. 16, 2025

(51) Int. Cl.
*G01R 33/07* (2006.01)
*H03F 3/21* (2006.01)

(52) U.S. Cl.
CPC ............... *G01R 33/07* (2013.01); *H03F 3/21* (2013.01)

(58) Field of Classification Search
CPC .. G01R 33/07; G01R 33/0041; G01R 33/075; G01R 33/0029; H03F 3/21
See application file for complete search history.

(56) References Cited

U.S. PATENT DOCUMENTS 5,621,319 A 4/1997 Bilotti et al.
7,236,415 B2 * 6/2007 Forbes ................ G11C 11/4091 365/207
7,425,821 B2 9/2008 Monreal et al.
7,990,209 B2 8/2011 Romero
8,269,491 B2 9/2012 Cummings et al.
8,416,014 B2 4/2013 Romero
8,786,279 B2 7/2014 Petrie
9,046,562 B2 6/2015 Cummings et al.
9,547,048 B2 1/2017 Romero
9,817,083 B2 11/2017 Romero
(Continued)

OTHER PUBLICATIONS

Pavan Ashokrao Kale, Pranav Kulkarni (Improved Sample and Hold Circuit using MOSFET) (Year: 2014).*
(Continued)

*Primary Examiner* — Alvaro E Fortich
(74) *Attorney, Agent, or Firm* — Daly, Crowley, Mofford & Durkee, LLP

(57) ABSTRACT

According to some embodiments, a sensor includes: one or more sensing elements configured to generate a magnetic field signal having a magnetic field component that varies in response to a magnetic field and an offset component contributed by the one or more sensing elements; a modulation circuit configured to modulate the magnetic field component of the magnetic field signal at a modulation frequency; an amplifier configured to receive the modulated signal and provide an amplified modulated signal having a current responsive to at least the magnetic field and the offset contributed by the one or more sensing elements; and a sample and hold circuit configured to receive the amplified modulated signal and provide a conditioned signal having a current that varies in response to the magnetic field signal and having substantially zero offset contribution from the one or more sensing elements and from the amplifier.

21 Claims, 8 Drawing Sheets

(56) References Cited

U.S. PATENT DOCUMENTS

| | | | | |
|---|---|---|---|---|
| 10,430,296 | B2 | 10/2019 | Cesaretti et al. | |
| 10,481,220 | B2 | 11/2019 | Alpago et al. | |
| 10,557,726 | B2 | 2/2020 | Lassalle-Balier | |
| 10,839,920 | B2 | 11/2020 | Cesaretti et al. | |
| 10,866,289 | B2 | 12/2020 | Cook | |
| 10,929,252 | B2 | 2/2021 | Cesaretti et al. | |
| 11,047,933 | B2 | 6/2021 | Romero et al. | |
| 11,199,424 | B2 | 12/2021 | Lassalle-Balier et al. | |
| 11,221,203 | B1 | 1/2022 | Ferrer et al. | |
| 11,327,882 | B2 | 5/2022 | Sarwar et al. | |
| 11,333,486 | B2 | 5/2022 | Rigoni et al. | |
| 11,333,718 | B2 | 5/2022 | Ronis et al. | |
| 11,463,053 | B1 * | 10/2022 | Znojemsky | H03F 3/68 |
| 11,467,928 | B2 | 10/2022 | Cesaretti et al. | |
| 11,624,799 | B2 | 4/2023 | Cesaretti et al. | |
| 11,733,024 | B2 | 8/2023 | Cesaretti et al. | |
| 11,768,259 | B1 | 9/2023 | Rubinsztain et al. | |
| 2008/0094055 | A1 * | 4/2008 | Monreal | G01D 3/02<br>324/117 H |
| 2015/0040687 | A1 * | 2/2015 | Ariyama | G01R 33/0029<br>73/862.381 |
| 2015/0180355 | A1 * | 6/2015 | Freeman | H02M 1/12<br>363/21.04 |
| 2018/0053564 | A1 | 2/2018 | Zhang | |
| 2019/0257669 | A1 * | 8/2019 | Fujiura | G01R 33/06 |
| 2020/0400755 | A1 | 12/2020 | Basu et al. | |

OTHER PUBLICATIONS

Extended European Search Report dated Sep. 19, 2025, for European Patent Application No. 25157505.6; 9 pages.
U.S. Appl. No. 18/465,307, filed Sep. 12, 2023, Fahmy.
Response to Extended European Search Report dated Sep. 19, 2025, for European Patent Application No. 25157505.6; Response filed Feb. 10, 2026; 12 pages.

* cited by examiner

600

MAGNETIC FIELD SENSORS WITH CURRENT MODE OFFSET AVERAGING

BACKGROUND

Magnetic field sensors—such as Hall effect, Giant Magnetoresistance (GMR), and Tunnel Magnetoresistance (TMR) sensors—are used in a wide variety of applications including industrial and consumer applications. As one example, magnetic field sensors are widely used in the automotive industry for mechanical position sensing, and for mechanical switches and latches.

SUMMARY

Hall effect elements or plates experience imbalances due to resistance gradients, geometrical asymmetries and piezoresistive effects which can introduce an offset voltage. The magnitude and polarity of the offset voltage are a function of stresses in the semiconductor from which the element is formed, which stresses vary with mechanical pressure and temperature. Various techniques have been used to address and cancel the Hall offset voltage, including chopper stabilization techniques.

One type of chopped Hall effect sensor includes a switched Hall plate, a chopped amplifier, and a low pass filter. The switched Hall plate, sometimes referred to alternatively as a spinning Hall plate, includes a Hall element having (typically) four contacts and a modulation switch circuit to periodically connect the supply voltage and the amplifier input to one pair of contacts or the other. Quadrature phases of operation are defined by complementary clock signals. Use of such a switched Hall plate provides a way to discriminate the Hall offset voltage (referred to herein as offset component) from the magnetically induced signal (referred to herein as the magnetic field component). In one such circuit, the switched Hall plate modulates the magnetic field component and the offset component remains substantially invariant. The chopped amplifier demodulates the magnetic field component and modulates the offset component which is then attenuated by the low pass filter to provide the sensor output signal. Examples of chopped sensors are shown and described in U.S. Pat. No. 5,621,319, issued on Apr. 15, 1997, and in U.S. Pat. No. 7,425,821, issued on Sep. 16, 2008.

Disclosed herein are structures and techniques for providing low-cost magnetic field sensors with smaller die area, improved offset handling, and less susceptibility to signal path saturation compared to the state of the art. Disclosed embodiments utilize a current mode signal path in which signal conditioning (e.g., offset averaging, demodulation, hysteresis, etc.) is performed in the current domain. Embodiments of the present disclosure may be deployed in various types of devices and systems, including but not limited switches, latches, and linear sensors.

According to one aspect of the present disclosure, a sensor includes: one or more sensing elements configured provide a magnetic field signal having a magnetic field component that varies in response to a magnetic field and an offset component contributed by the one or more sensing elements; a modulation circuit having an input coupled to receive the magnetic field signal and an output to provide a modulated signal, the modulation circuit configured to modulate the magnetic field component of the magnetic field signal at a modulation frequency; an amplifier having an input coupled to receive the modulated signal and an output to provide an amplified modulated signal, the amplified modulated signal having a magnetic field component that varies in response to the magnetic field, a first offset component contributed by the one or more sensing elements, and a second offset component contributed by the amplifier, said components determining a current of the amplified modulated signal; and a sample and hold circuit having an input to receive the amplified modulated signal and an output to provide a conditioned signal having a current that varies in response to the magnetic field signal and having substantially zero offset contribution from the one or more sensing elements and from the amplifier.

In some embodiments, the sensor can be configured to operate in a plurality of phases, wherein: in a first phase of operation, a magnitude of the magnetic field signal is defined by a sum of the magnetic field component and the offset component; and in a second phase of operation, the magnitude of the magnetic field is defined by a difference of the magnetic field component and the offset component. In some embodiments, in the first phase of operation, a magnitude of the modulated signal is substantially equal to the magnitude of the magnetic field signal; and in the second phase of operation, the magnitude of the modulated signal is substantially equal to a negative of the magnitude of the magnetic field signal.

In some embodiments, the sample and hold circuit can include a plurality of switches operated according to one or more clock signals. In some embodiments, at least one of the one or more clock signals alternates between two different phases of the plurality of phases. In some embodiments, the sample and hold circuit can include a plurality of memory devices each controllably connected to the amplifier output via one or more of the plurality of switches. In some embodiments, different ones of the plurality of memory devices may be arranged to sample and hold the amplified modulated signal during different phases of operation.

In some embodiments, the plurality of memory devices can include a plurality of transistors. In some embodiments, the plurality of transistors can include one or more metal-oxide-semiconductor field-effect transistors (MOSTFETs). In some embodiments, the plurality of transistors can include at least six transistors arranged to form at least two current mirrors. In some embodiments, the sample and hold circuit may include a node connected to outputs of one or more memory devices arranged to sample and hold the amplified modulated signal during a first phase of operation and to outputs of one or more memory devices arranged to sample and hold the amplified modulated signal during a second phase of operation.

In some embodiments, the one or more sensing elements can include Hall effect elements. In some embodiments, the one or more Hall effect elements may be provided as one or more spinning Hall plates. In some embodiments, the magnetic field signal, the modulated signal, the amplified modulated signal, and the conditioned signal are all differential signals. In some embodiments, the system can further include a comparator having an input coupled to receive the conditioned signal and an output to provide a comparator signal responsive to a comparison of the conditioned signal to a threshold value.

In some embodiments, the threshold value can be zero. In some embodiments, the sensor can further include a switch point circuit coupled between the sample and hold circuit and the comparator, the switch point circuit configured to generate a switch point signal and combine the switch point signal with the conditioned signal. In some embodiments, the switch point circuit can be configured to generate the switch point signal with hysteresis. In some embodiments, the modulated signal can be a voltage domain signal and the amplified signal can be a current domain signal. In some embodiments, the amplifier can be provided as an operational transconductance amplifier.

According to one aspect of the disclosure, a sensor includes: one or more sensing elements configured to generate a magnetic field signal having a magnetic field component that varies in response to a magnetic field and an offset component contributed by the one or more sensing elements; a modulation circuit configured to modulate the magnetic field component of the magnetic field signal at a modulation frequency; an amplifier configured to receive the modulated signal and provide an amplified modulated signal having a current responsive to at least the magnetic field and the offset contributed by the one or more sensing elements; and a sample and hold circuit configured to receive the amplified modulated signal and provide a conditioned signal having a current that varies in response to the magnetic field signal and having substantially zero offset contribution from the one or more sensing elements and from the amplifier.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

Figure 1:
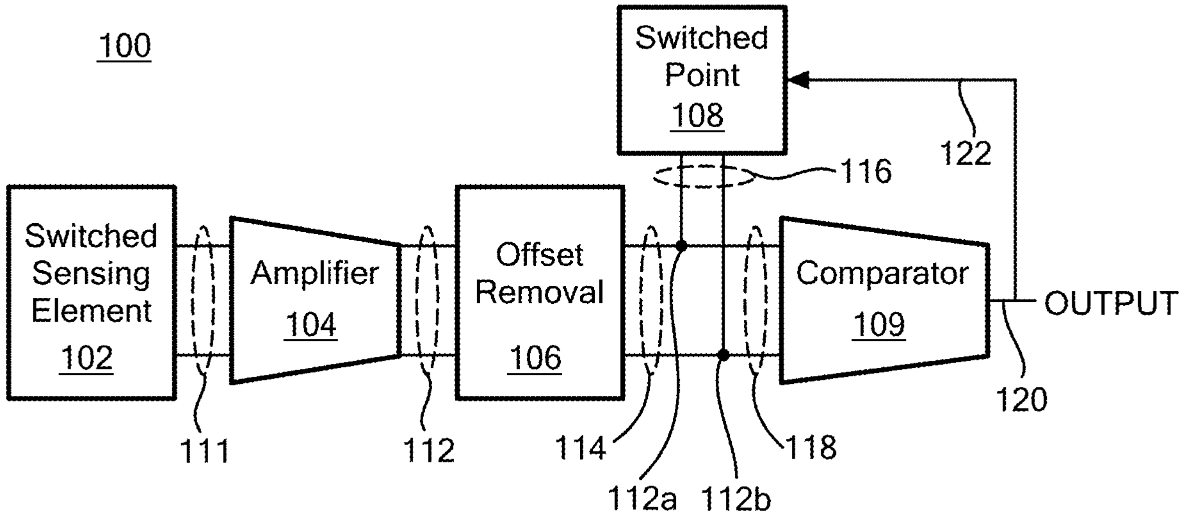
FIG. 1 is a schematic diagram showing a magnetic field sensor with current mode signal conditioning, according to some embodiments.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall effect element (or "Hall element"), a magnetoresistance element, or a magnetotransistor. As is known, there are different types of Hall elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses a magnetic field sensing element in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch/latch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "voltage domain" and "voltage mode" are used to describe a signal having a voltage (or being a voltage) that varies in response to a magnitude being sensed, a circuit configured to process such a signal, or a signal path configured to carry such a signal. The terms "current domain" and "current mode" are used to describe a signal having a current (or being a current) that varies in response to a magnitude being sensed, a circuit configured to process such a signal, or a signal path configured to carry such a signal.

FIG. 1 shows an example of a magnetic field sensor 100 with current mode signal conditioning. Illustrative sensor 100 includes a switched sensing element block 102 comprising one or more magnetic field sensing elements and circuitry configured to generate a modulated signal 111 responsive to a magnetic field (e.g., a field generated by a magnetic switch or latch).

In one example, the magnetic field sensing elements can include one or more Hall elements configured to generate an (unmodulated) magnetic field signal responsive to the magnetic field. The magnetic field signal can include a magnetic field component and an offset component, as previously discussed. The circuitry of block 102 may be configured to "spin" the Hall elements(s), meaning it can connect the supply voltage to different pairs contacts in different phases of operation. In some cases, two phases may be used. In other cases, four phases may be used. The different phases of operation may be defined by complementary clock signals generated in response to an on-chip clock (not shown). The circuitry of block 102 can also be configured to modulate the magnetic field component to a chopping frequency ($f_{chop}$, sometimes referred to as a "carrier frequency") while the offset component remains at baseband. Thus, the resulting modulated signal 111 has a modulated magnetic field component and substantially invariant offset component. The circuitry of block 102 may be the same as or similar to the spinning and chopping circuitry described in U.S. Pat. No. 7,425,821, issued on Sep. 16, 2008, for example. Block 102 may be referred to as a switched Hall plate or a spinning Hall plate.

The amplitude of modulated signal 111 can be proportional to some magnitude being sensed (e.g., a position of a latch or switch). In some embodiments, modulated signal 111 may be a voltage domain signal. In other embodiments, modulated signal 111 may be a current domain signal.

Sensor 100 can further include an amplifier 104, an offset removal circuit 106, a switch point circuit 108, and a comparator circuit 109 (or "comparator" for short). As described below, circuits 106, 108, and 109 are configured for to operate on current domain signals, which can result in smaller die area, improved offset handling, and less susceptibility to signal path saturation compared to the state of the art.

Amplifier 104 can be configured to receive modulated signal 111 and output an amplified signal 112, the amplified signal 112 being in the current domain. Amplified signal 112 corresponds to an amplified version of modulated signal 111, and thus may have a magnetic field component ($V_{Field}$) that takes on different values during different chopping phases, a substantially invariant sensing element offset component ($V_{HPOff}$), and an amplifier offset component ($V_{AmpOff}$). In some embodiments, amplifier 104 can be provided as a transconductance amplifier (e.g., an operational transconductance amplifier) configured to convert a voltage domain modulated signal 111 into a current domain amplified signal 112.

Offset removal circuit 106 is configured to demodulate and remove offset from amplified signal 112, providing a corresponding conditioned signal 114 as output. Both the amplified signal 112 and the conditioned signal 114 are in the current domain. In more detail, during different chopping/modulation phases, offset removal circuit 106 can sample and hold amplified signal 112, and then generate an average of the held signals (with the appropriate sign) to remove the offset. Offset removal circuit 106 functions as a notch filter that attenuates the offset component from amplified signal 112 modulated at the chopping frequency. In addition, offset removal circuit 106 can include an anti-alias filter arranged in front of sampling and holding circuitry. Illustrative implementations of offset removal circuit 106 are shown and described with later figures.

Switch point circuit 108 is configured to generate a switch point signal 116, in the current domain, that is combined with conditioned signal 114 to provide a comparator input signal 118 having a value required to operate according to one predetermined switch points. Because both switch point signal 116 and conditioned signal 114 are in the current domain, their amplitudes can be combined (e.g., summed) directly at nodes 112*a*, 112*b*. In some cases, switch point signal 116 can be negative and thus comparator input signal 118 can correspond to difference in current between switch point signal 116 current value and conditioned signal 114.

Comparator 109 is configured to provide a sensor output signal 120 having a state determined by comparator input signal 118. For example, output signal 120 can have a first state (e.g., a first amplitude) when comparator input signal 118 is negative and a second state (e.g., a second, different amplitude) when comparator input signal 118 is positive. In some cases, the current difference between signals 116 and 114 can be converted to voltage at the input of comparator 109. Comparator input signal 118 can be in the voltage domain. Thus, sensor output signal 120 switches state when comparator input signal 118 changes polarity. Output signal 120 can be in voltage domain.

Switch point signal 116 generated by switch point circuit 108 controls the sensed magnitude at which the sensor output changes state. In other words, it controls the switching point of the sensor 100. For example, if a particular application requires the sensor output 120 to change state when the conditioned signal 114 exceeds B microamps, switch point circuit 108 can be configured to generate switch point signal 116 having an amplitude of −B microamps.

In some embodiments, switch point circuit 108 may be configured generate switch point signal 116 with hysteresis, thus allowing for multiple different switch points and avoiding unwanted rapid switching due to noise, vibration, etc. For example, switch point circuit 108 can vary switch point signal 116 such that output signal 120 changes from a first state (e.g., a "switched off" state) to a second state (e.g., a "switched on" state) when conditioned signal 114 is greater than or equal to $B_{OP}$ microamps and then changes back to the first state when conditioned signal 114 is less than $B_{RP}$ microamps, where $B_{OP}>B_{RP}$. To implement hysteresis, switch point circuit 108 may utilize sensor output signal 120, as illustrated by line 122 in FIG. 1. Switch point signal 116 may also be referred to as a hysteresis signal.

Illustrative implementations of switch point circuit 108 are shown and described with later figures.

In the preceding description, B, $B_{OP}$, and $B_{RP}$ represent values of predetermined switch points. These values may be hardwired into the sensor 100 or programmed onto a memory (e.g., an electrically erasable programmable read-only memory, EEPROM) associated with the sensor.

As shown, signals 111, 112, 114, 116, 118 may be differential signals, meaning that they can each comprise two complementary signals (e.g., signals having opposite polarity), referred to as positive and negative signals. Thus, for example, the magnitude of signal 111 can correspond to twice the sensed magnetic field and offset, i.e., $2(V_{Field}+V_{HPOff})$, using notation introduced below. It will be appreciated a single magnetic field sensing element (e.g., a single Hall plate) can be used to generate both the positive and negative signal halves. In some cases, block 102 can include two or more magnetic field sensing elements (e.g., two Hall elements), each configured to generate positive and negative signals. The two or more differential signals can be combined for improved noise reduction and/or offset reduction.

Figure 1A:
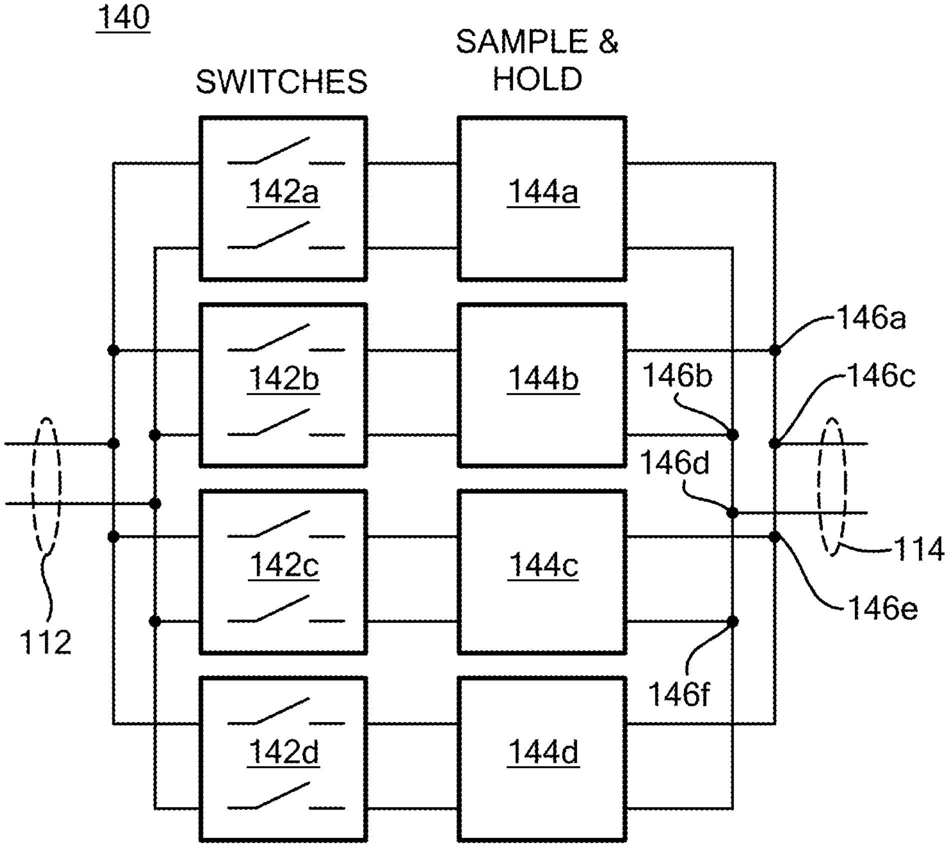
FIG. 1A is schematic diagram showing an offset removal circuit that may be provided with the sensor of FIG. 1, according to some embodiments.

FIG. 1A illustrates an offset removal circuit 140 that may be provided with the sensor of FIG. 1, according to some embodiments. As shown, offset removal circuit 140 can include a plurality of switching blocks 142*a-d* (142 generally) each configured to receive amplified signal 112 and a plurality of sample-and-hold circuits 144*a-d* (144 generally, ones of the plurality corresponding to ones of the plurality of switching blocks 142) connected as shown to provide conditioned signal 114. In the example of FIG. 1A, circuit 140 includes four (4) switching blocks 142 and four (4) sample-and-hold circuits 144 that can be controlled using a four-phase clock signal. Other implementations can have two pairs of switches, for example. Also in this example, each of switching blocks 142 can include two switches to separately process the positive and negative signals of differential amplified signal 112.

Differential amplified signal 112 is steered by the switches blocks 142 into the corresponding sample-and-hold circuits 144. Sample-and-hold circuits 144 are configured to operate in the current domain and, thus, conditioned signal 114 is provided as an average of their outputs by arithmetic addition of their output currents via connecting nodes 146*a-f.*

Figure 2:
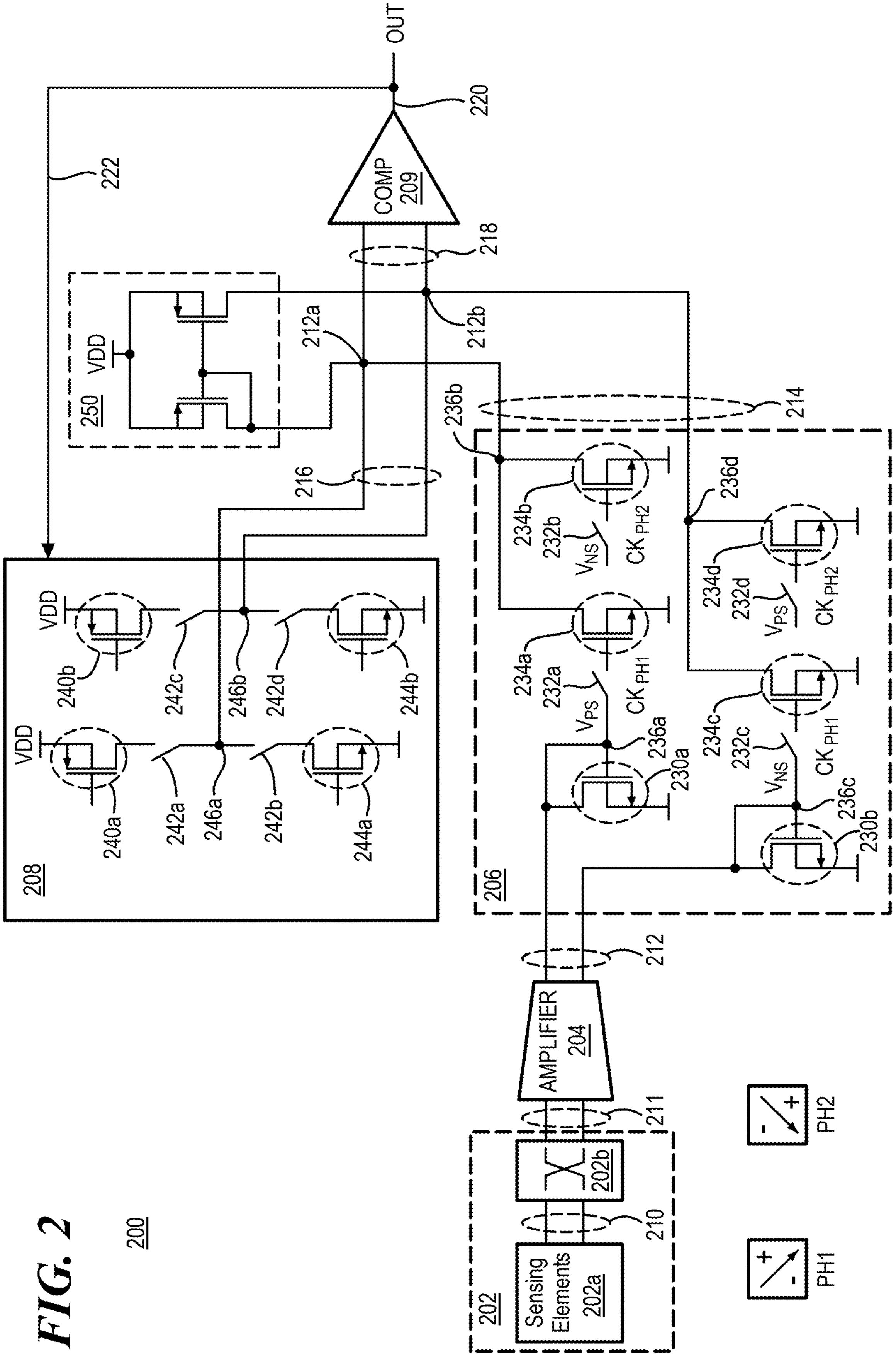
FIG. 2 is a schematic diagram showing a two-phase implementation of a magnetic field sensor with current mode signal conditioning, according to some embodiments.

FIG. 2 shows a two-phase implementation 200 of a magnetic field sensor with current mode signal conditioning, according to some embodiments. Implementation 200 includes a block 202 comprising one or more magnetic field sensing elements and circuitry configured to generate a magnetic field signal 210 responsive to a magnetic field (e.g., a field generated by a magnetic switch or latch), an amplifier 204, an offset removal circuit 206, a switch point circuit 208, and a comparator circuit (or "comparator") 209.

The general operation of block 202, amplifier 204, offset removal circuit 206, switch point circuit 208, and comparator 209 can be the same as or similar to block 102, amplifier 104, offset removal circuit 106, switch point circuit 108, and comparator 109 of FIG. 1, respectively.

As shown, block 202 can include one or more magnetic field sensing elements 202*a* (e.g., Hall elements) and a modulation circuit 202*b*. The sensing elements 202*a* can each have a plurality of contacts (e.g., four contacts each) and block 202 can include circuitry configured to connect a supply voltage to different pairs contacts in different phases of operation (e.g., two or four phases of operation). This results in a "spun" magnetic field signal 210, examples of which are shown in later figures. Magnetic field signal 210 can include a magnetic field component and an (unwanted) offset component. Modulation circuit 202*b* can be configured to modulate the magnetic field component of signal 210 to a chopping frequency ($f_{chop}$) while the offset component remains at baseband. Thus, a resulting modulated signal 211 has a modulated magnetic field component and substantially invariant offset component. The circuitry of block 202 may be the same as or similar to the spinning and chopping circuitry described in U.S. Pat. No. 7,425,821, issued on Sep. 16, 2008, for example.

Amplifier 204 can be configured to receive modulated signal 211 and output an amplified signal 212, the amplified signal 212 being in the current domain. Amplified signal 212 corresponds to an amplified version of modulated signal 211, and thus may have a magnetic field component ($V_{Field}$) that takes on different values during different chopping phases, a substantially invariant sensing element offset component ($V_{HPOff}$), and an amplifier offset component ($V_{AmpOff}$). In some embodiments, amplifier 204 can be provided as a transconductance amplifier (e.g., an operational transconductance amplifier) configured to convert a voltage domain modulated signal 211 into a current domain amplified signal 212.

Offset removal circuit 206 is configured to demodulate and remove offset from amplified signal 212, providing a corresponding conditioned signal 214 as output. Both the amplified signal 212 and the conditioned signal 214 are in the current domain. Moreover, both signals 212, 214 are differentials signal having a positive half and a negative half.

In implementation 200, offset removal circuit 206 can include a positive signal (PS) path to process the positive half of amplified signal 212 and a negative signal (PS) path to process the negative half of amplified signal 212.

As shown, the PS path of offset removal circuit 206 can include an upfront transistor 230*a* and two other transistors 234*a,b* connected via respective switches 232*a,b*. All three transistors 230*a*, 234*a*, 234*b* may be metal-oxide semiconductors (NMOS) transistors. The PS path also includes nodes 236*a-b*. Node 236*a* ($V_{PS}$) is connected to a first terminal of amplifier 204 and to both the gate and drain terminals of transistor 230*a*. Node 236*b* is an output of circuit 206 providing the positive half of conditioned signal 214. The source terminal of transistor 230*a* can be connected to a reference voltage (e.g., a reference negative voltage). Switch 232*a* has two terminals, one connected to node 236*a* and the other connected to transistor 234*a*. Transistor 234*a* has a gate terminal connected to switch 232*a*, a drain terminal connected to node 236*b*, and a source terminal connected to the reference voltage. Switch 232*b* has two terminals, one connected to a node 236*c* ($N_{PS}$) of the NS path and the other connected to transistor 234*b*. Transistor 234*b* has a gate terminal connected to switch 232*b*, a drain terminal connected to node 236*b*, and a source terminal connected to the reference voltage.

The NS path of offset removal circuit 206 can include an upfront transistor 230*b* and two other transistors 234*c,d* connected via respective switches 232*c,d*. All three transistors 230*b*, 234*c*, 234*d* may be NMOS transistors. The NS path also includes nodes 236*c-d*. Node 236*c* ($V_{NS}$) is connected to a second terminal of amplifier 204 and to both the gate and drain terminals of transistor 230*b*. Node 236*d* is an output of circuit 206 providing the negative half of conditioned signal 214. The source terminal of transistor 230*b* is connected to a reference voltage (e.g., a reference negative voltage). Switch 232*c* has two terminals, one connected to node 236*c* and the other connected to transistor 234*c*. Transistor 234*c* has a gate terminal connected to switch 232*c*, a drain terminal connected to node 236*d*, and a source terminal connected to the reference voltage. Switch 232*d* has two terminals, one connected to node 236*a* ($V_{PS}$) of the PS path and the other connected to transistor 234*d*. Transistor 234*d* has a gate terminal connected to switch 232*d*, a drain terminal connected to node 236*d*, and a source terminal connected to the reference voltage.

The switches 236*a-d* can be provided as field-effect transistors (FETs) and, in some cases, as metal-oxide-semiconductor field-effect transistors (MOSTFETs).

Figure 4:
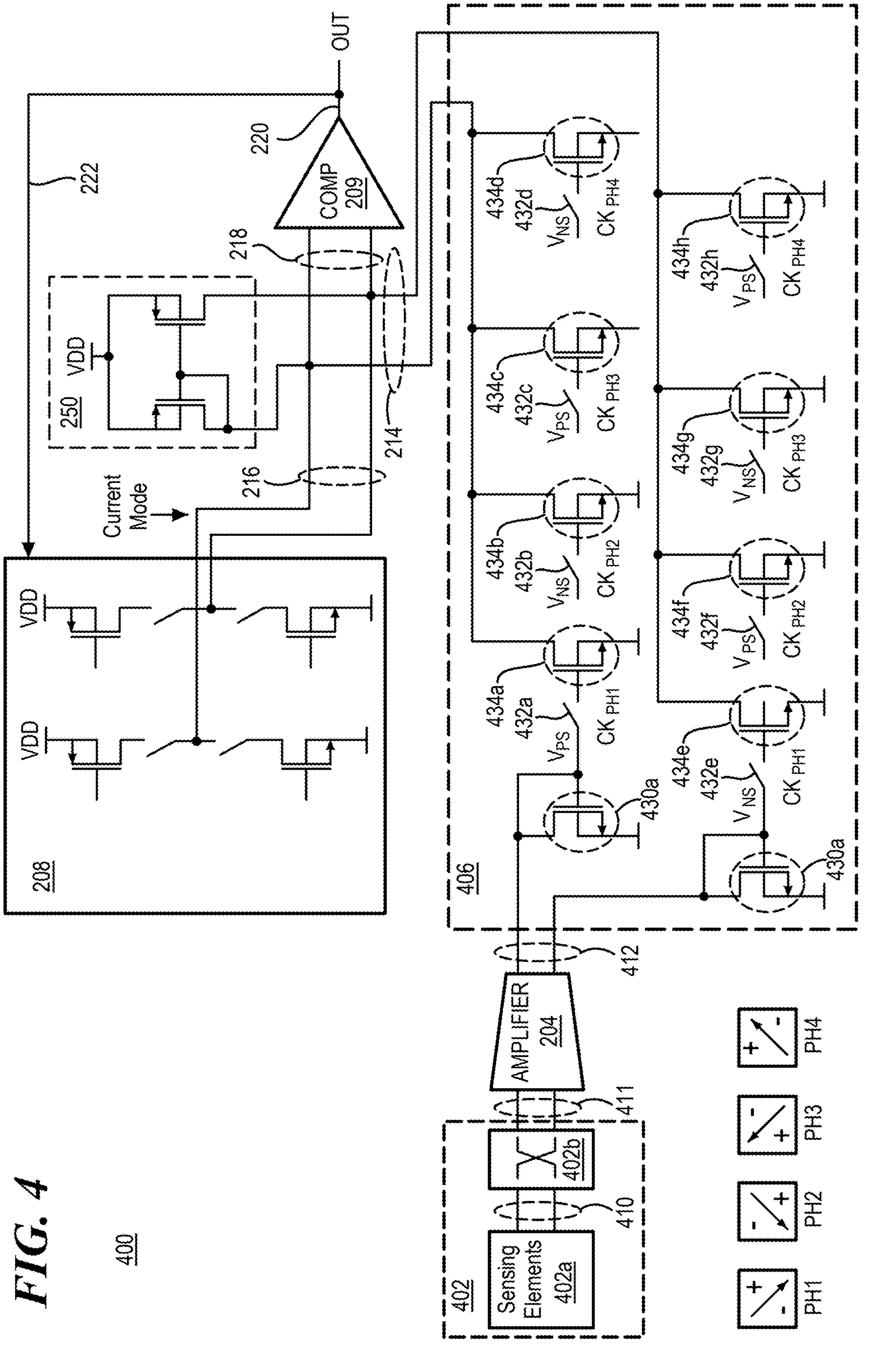
FIG. 4 is a schematic diagram showing a four-phase implementation of a magnetic field sensor with current mode signal conditioning, according to some embodiments.

Switches 232*a-d* can be turned on/off in different phases of operation in response to one or more clocks signals (e.g., signals generated by an on-chip clock, not shown). The clock signals can have a frequency substantially equal to that of the chopping frequency ($f_{chop}$) used by modulation circuit 202*b*. In the two-phase implementation 200 of FIG. 2, switches 232*a,c* are controlled by a first clock signal $CK_{PH1}$ and switches 232*b,d* are controlled by a second clock signal $CK_{PH2}$. Examples of such clock signals are shown in later figures. FIG. 4 shows a four-phase implementation of an offset removal circuit in which both the PS and NS paths have four switches controlled by four clocks signals.

When switch 232*a* is closed, $V_{PS}$ (a voltage produced by current through 230*a*) is copied onto the gate of transistor 234*a*, in a current mirror arrangement. When switch 232*b* is closed, $V_{NS}$ (a voltage produced by current through 230*b*) is copied onto the gate of transistor 234*b*. When switch 232*c* is closed, $V_{NS}$ is copied onto the gate of transistor 234*c*. When switch 232*d* is closed, $V_{PS}$ is copied onto the gate of transistor 234*d*. Thus, the transistors function as current mirrors.

The offset removal circuit 206 implements sample-and-hold using floating gate transistors, i.e., the four switched transistors 234*a-d*. In the first phase, transistors 234*a* and 234*c* sample values (e.g., currents) of the positive and negative halves of modulated signal 212, respectively. In the second phase, transistors 234*b* and 234*d* sample values (e.g., currents) of negative and positive halves of modulated signal 212, respectively. That is, transistors 234*a-d* are operable to store information about the sensed magnetic field. The sampled values are averaged at nodes 236*b*, 236*d* such that, in steady state, offset removal circuit 206 acts as a moving average filter, averaging the sampled values over the last two phases, to provide conditioned signal 214. Demodulation of the magnetic field signal is achieved by selecting which of the transistors 234*a-d* are connected to signals $V_{PS}$ and $V_{NS}$.

Switch point circuit 208 is configured to generate a switch point signal 216, in the current domain, that is combined with conditioned signal 214 to provide a comparator input signal 218 having a value required to operate according to one predetermined switch points. Because both switch point signal 216 and conditioned signal 214 are in the current domain, their amplitudes can be combined (e.g., summed) directly at nodes 212*a*, 212*b*.

According to implementation 200, switch point circuit 208 can include a first branch to generate the positive half of switch point signal 216 and a second branch to generate the negative half of switch point signal 216.

The first branch of switch point circuit 208 can include a PMOS transistor 240*a*, a first switch 242*a*, a second switch 242*b*, and an NMOS transistor 244*a*. PMOS transistor 240*a* has a source terminal connected to a reference voltage (VDD), a drain terminal connected to a terminal of switch 242*a*, and a gate terminal connected to a sensor output signal 220 via a feedback line 222. The reference voltage can set/adjusted using one or more circuit elements, such as a diode, resistor, etc. In some cases, the reference voltage may be derived from a programmable value stored in memory (e.g., using a digital-to-analog converter, DAC). NMOS transistor 244*a* has a source terminal connected to the reference voltage, a drain terminal connected to a terminal of switch 242*b*, and a gate terminal connected to a sensor output signal 220 via a feedback line 222. The other terminals of switches 242*a*, 242*b* are connected at a node 246*a* providing the positive half of switch point signal 216.

The second branch of switch point circuit 208 can include a PMOS transistor 240*b*, a first switch 242*c*, a second switch 242*d*, and an NMOS transistor 244*b*. PMOS transistor 240*b* has a source terminal connected to the reference voltage (VDD), a drain terminal connected to a terminal of switch 242*c*, and a gate terminal connected to a sensor output signal 220 via a feedback line 222. NMOS transistor 244*b* has a source terminal connected to the reference voltage, a drain terminal connected to a terminal of switch 242*d*, and a gate terminal connected to a sensor output signal 220 via a feedback line 222. The other terminals of switches 242*c*, 242*d* are connected at a node 246*b* providing the negative half of switch point signal 216.

Switches 242*a-d* can be turned on/off in response to one or more signals. For example, signal 222 can be used to select if switches 242*c-b* or switches 242*a-d* are closed. In some embodiments, diagonal switches 242*a*, 242*d* can be controlled such that are turned on/off at the same time. Likewise, diagonal switches 242*b*, 240*c* can be controlled by the same clock signal, different from that controlling switches 242*a*, 242*d*. In some cases, a fixed current can be applied to nodes 212*a* and 212*b*, and circuit 208 can provide hysteresis using signal 222 to control switching. Switches 242*a-d* can define the current reference of $B_{OP}$ or $B_{RP}$. For example, the switches of circuit 208 can be controlled such that circuit 208 produces current $I_{BOP}=B_{OP}$*Gain [Ampere/Gauss] or $I_{BRP}=B_{RP}$*Gain [Ampere/Gauss].

The pairs of transistors 240*a-b* and 244*a-b* can be configured to provide currents equivalent to $B_{OP}$ and $B_{RP}$, respectively.

Implementation 200 can also include a current mirror 250 configured to copy the current from one side of differential signal 214 to the other side of signal 214. If the two currents are equal, then they can cancel at node 212*b*. Circuit 208 defines if the node goes up and down depending on the state of the switches 242*a-d*.

Comparator 209 is configured to provide a sensor output signal 220 having a state determined by comparator input signal 218, such as described above for comparator 109 of FIG. 1. Switch point signal 216 generated by switch point circuit 208 controls the sensed magnitude at which the sensor output changes state. In other words, it controls the switching point of the sensor implementation 200.

Figure 3A:
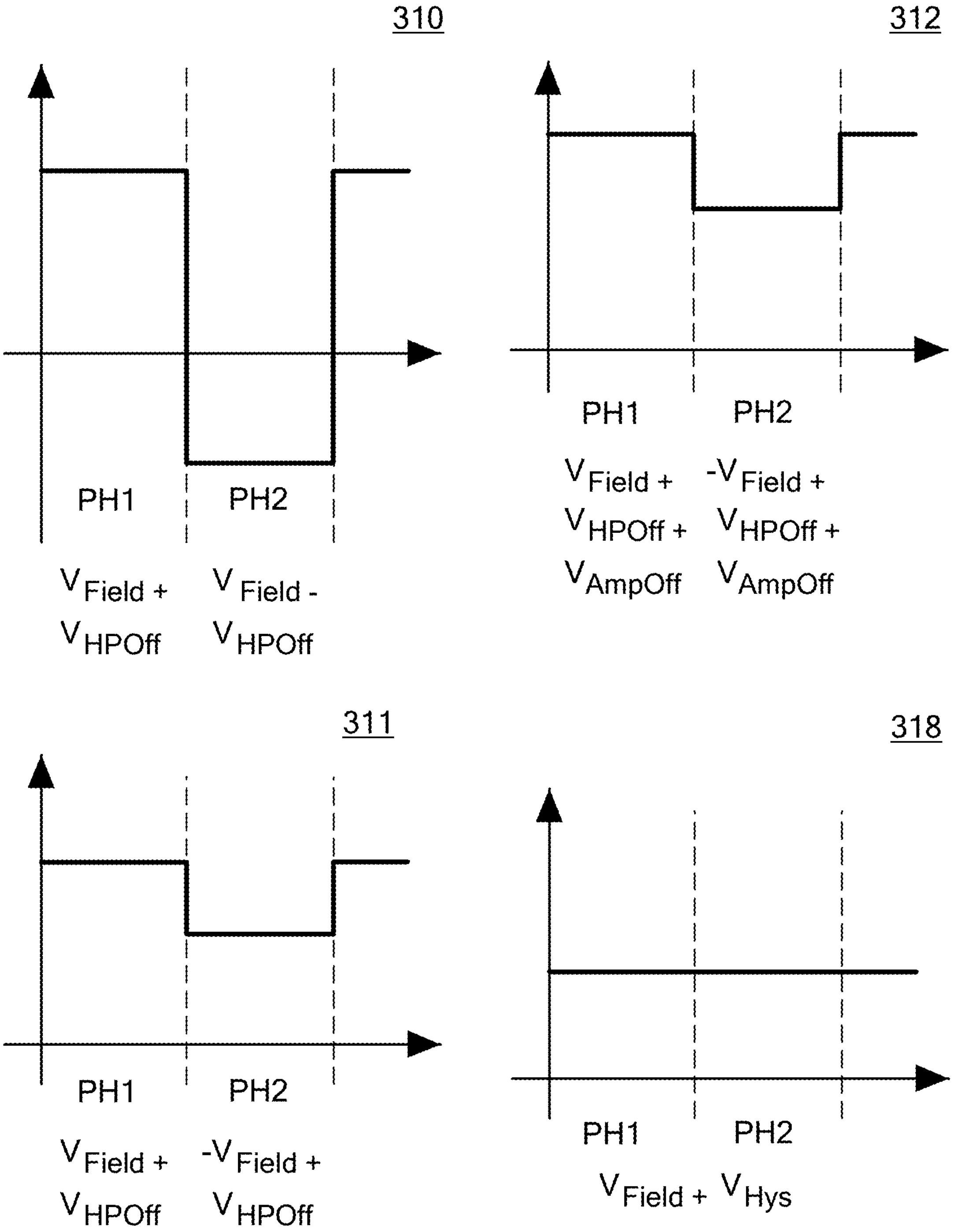
FIG. 3A illustrates signals that may be generated by the sensor of FIG. 2.

FIG. 3A illustrates signals that may be generated by the two-phase sensor implementation of FIG. 2. For example, signals 310, 311, 312, 318 can correspond to signals 210, 211, 212, and 218, respectively, of FIG. 2.

A spun magnetic field signal 310 can be generated, for example, by sensing elements 202*a* of FIG. 2. Spun magnetic field signal 310 can have an amplitude (e.g., a voltage) responsive to an external magnetic field ($V_{Field}$) and to unwanted offset introduced by one or more magnetic field sensing elements ($V_{HPOff}$). During a first phase (PH1) the amplitude can be equal to $V_{Field}+V_{HPOff}$ and during a second phase (PH2) the amplitude can be equal to $V_{Field}-V_{HPOff}$ (e.g., as a result of Hall plate spinning, as previously discussed).

The duration of PH1 and PH2 may be defined a modulation chopping frequency, $f_{chop}$. For example, PH1 and PH2 may be equal to the chopping period, $1/f_{chop}$.

A modulated signal 311 can be generated, for example, by modulation circuit 202*b* of FIG. 2. Modulated signal 311 also has an amplitude (e.g., a voltage) responsive to $V_{Field}$ and $V_{HPOff}$, but with the magnetic field component modulated $f_{chop}$. Thus, as shown, during PH1 the amplitude can be equal to $V_{Field}+V_{HPOff}$, and during PH2 the amplitude can be equal to $-V_{Field}+V_{HPOff}$.

An amplified signal 312 can be generated, for example, by amplifier 204 of FIG. 2. Amplified signal 312 corresponds to an amplified version of modulated signal 311, but converted from voltage domain to the current domain and with an added amplifier offset component ($V_{AmpOff}$). Thus, as shown, during PH1 the amplitude (e.g., current) of signal 312 can be equal to $V_{Field}+V_{HPOff}+V_{AmpOff}$, and during PH2 the amplitude can be equal to $-V_{Field}+V_{HPOff}+V_{AmpOff}$.

Amplified signal 312 can be conditioned (e.g., by circuit 206 of FIG. 2) to remove unwanted offset and demodulate the signal, and then combined with a switch point signal (e.g., generated by circuit 208 of FIG. 2) to provide a comparator input signal 318 for input to a comparator (e.g., comparator 209 of FIG. 2). As shown, comparator input signal 318 is a baseband signal having an amplitude (e.g., a current) equal to $V_{Field}+V_{Hys}$, where $V_{Hys}$ denotes the switch point signal.

Figure 3B:
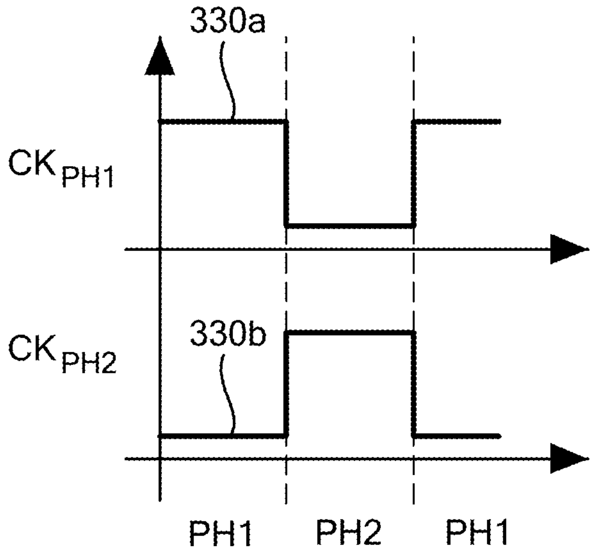
FIGS. 3B and 3C illustrate clock signal waveforms that may be used to control the sensor of FIG. 2.

FIG. 3B shows an example of clock signal waveforms that can be used to control the two-phase sensor implementation of FIG. 2. During PH1, a first clock signal 330*a* ($CK_{PH1}$) can be high and a second clock signal 330*b* ($CK_{PH2}$) can be low. During PH2, first clock signal 330*a* ($CK_{PH1}$) can be low and second clock signal 330*b* ($CK_{PH2}$) can be high. Thus, in some embodiments, complementary clock signals may be used.

Figure 3C:
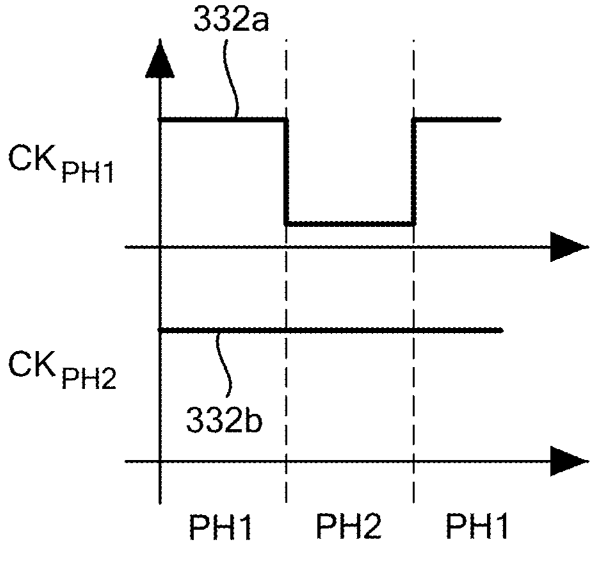

FIG. 3C shows an alternative clocking approach. Here, during PH1, a first clock signal 332*a* ($CK_{PH1}$) can be high and a second clock signal 332*b* ($CK_{PH2}$) can also be high. During PH2, first clock signal 332*a* ($CK_{PH1}$) can be low while second clock signal 332*b* ($CK_{PH2}$) remains high. The approach of FIG. 3C may be used to avoid the saturation of the comparator during startup and may be particularly useful for products that require a short awake time, as it may avoid having to wait for the comparator to slew back from saturation.

FIG. 4 shows a four-phase implementation 400 of a magnetic field sensor with current mode signal conditioning, according to some embodiments. For brevity, like elements of FIG. 2 are shown in FIG. 4 using like reference numerals and previously described features thereof may apply here as well.

Implementation 400 includes a block 402 comprising one or more magnetic field sensing elements and circuitry configured to generate a magnetic field signal 410 responsive to a magnetic field, amplifier 204, an offset removal circuit 406, switch point circuit 208, and comparator 209.

Block 402 can include one or more switched magnetic field sensing elements 402*a* configured to provide a "spun" magnetic field signal 410 having four phases, PH1-PH4. Modulation circuit 402*b* can be configured to modulate the magnetic field component of signal 410 to a chopping frequency ($f_{chop}$) while the offset component remains at baseband. Thus, a resulting modulated signal 411 has a modulated magnetic field component and substantially invariant offset component.

Amplifier 204 can be configured to receive modulated signal 411 and output an amplified signal 412 in the current domain.

Offset removal circuit 406 is similar to offset removal circuit 206 of FIG. 2, except that four switched transistors are provided on both the PS and NS path. In more detail, the PS path can include an upfront transistor 430*a* and four other transistors 434*a-c* connected via respective switches 432*a-d*, as shown. The NS path can include an upfront transistor 430*b* and four other transistors 434*e-h* connected via respective switches 432*e-h*, as shown. All ten transistors 430*a,b* and 434*a-h* may be NMOS transistors.

Switches 432*a-h* can be turned on/off in different phases of operation in response to four different clock signals, $CK_{PH1\text{-}4}$. The clock signals can have a frequency substantially equal to that of the chopping frequency ($f_{chop}$) used by modulation circuit 402*b*. In the implementation 400 of FIG. 4, switches 432*a,e* are controlled by a first clock signal $CK_{PH1}$, switches 432*b,f* are controlled by a second clock signal $CK_{PH2}$, switches 432*c,g* are controlled by a third clock signal $CK_{PH3}$, and switches 432*d,h* are controlled by a fourth clock signal $CK_{PH4}$.

The offset removal circuit 406 implements sample-and-hold using floating gate transistors. Sampled values of the magnetic field signal are averaged in the current domain. In steady state, offset removal circuit 406 acts as a moving average filter, averaging the sampled values over the last four phases, to provide conditioned signal 214. Demodulation of the magnetic field signal is achieved by selecting which of the transistors 434*a-h* are connected to signals $V_{PS}$ and $V_{NS}$.

Figure 5A:
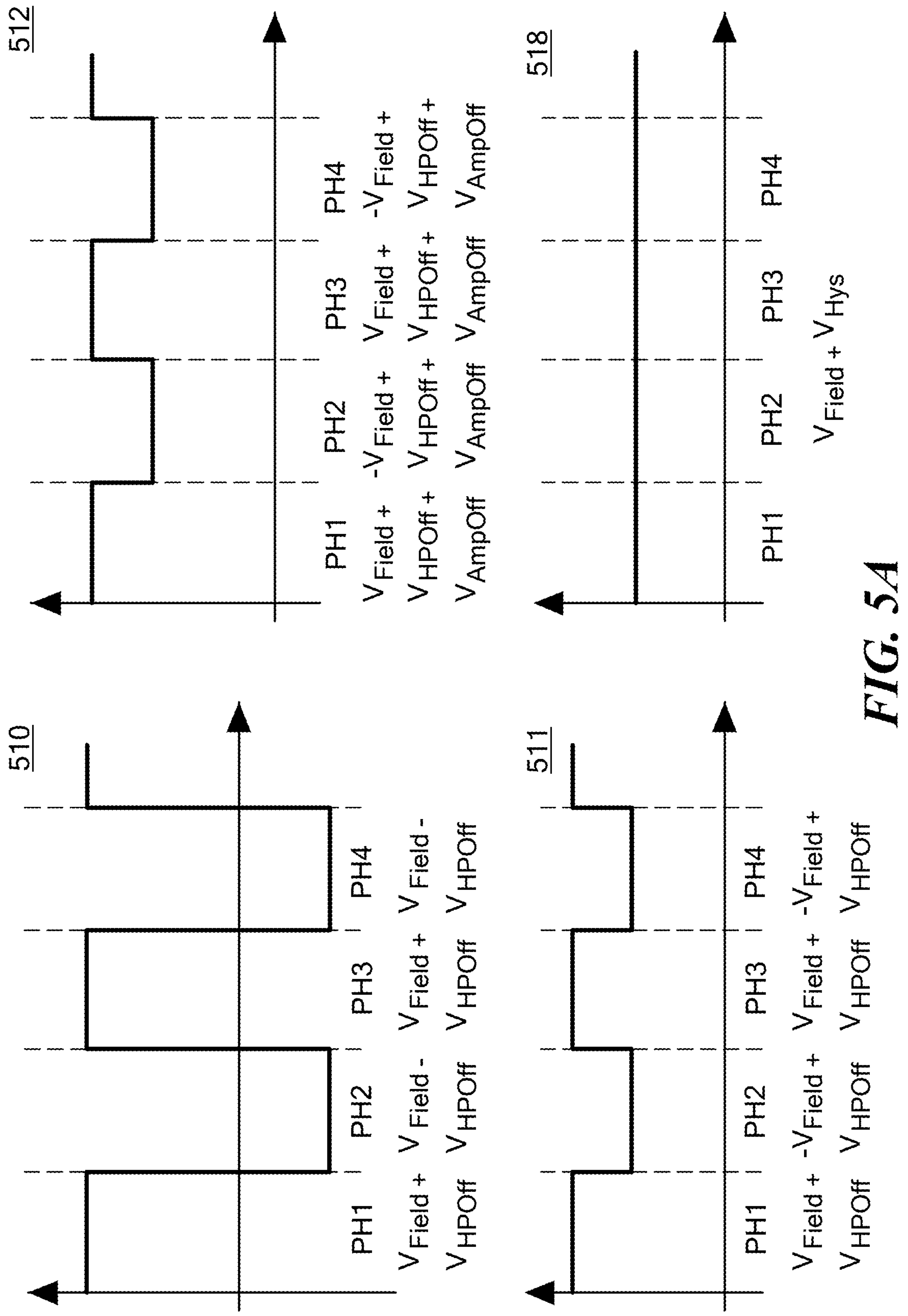
FIG. 5A illustrates signals that may be generated by the sensor of FIG. 4.

FIG. 5A illustrates signals that may be generated by the four-phase sensor implementation of FIG. 4. For example, signals 510, 511, 512, 518 can correspond to signals 410, 411, 412, and 218, respectively, of FIG. 4.

A spun magnetic field signal 510 can be generated, for example, by sensing elements 402*a* of FIG. 4. Spun magnetic field signal 510 can have an amplitude (e.g., a voltage) responsive to $V_{Field}$ and to $V_{HPOff}$. During the first and third phases (PH1 and PH3) the amplitude can be equal to $V_{Field}+V_{HPOff}$ and during the second and fourth phase (PH2 and PH4) the amplitude can be equal to $V_{Field}-V_{HPOff}$. The duration of PH1-4 may be defined a modulation chopping frequency, $f_{chop}$.

A modulated signal 511 can be generated, for example, by modulation circuit 402*b* of FIG. 4. Modulated signal 511 also has an amplitude (e.g., a voltage) responsive to $V_{Field}$ and $V_{HPOff}$, but with the magnetic field component modulated $f_{chop}$. Thus, as shown, during PH1 and PH3 the amplitude can be equal to $V_{Field}+V_{HPOff}$, whereas during PH2 and PH4 the amplitude can be equal to $-V_{Field}+V_{HPOff}$.

An amplified signal 512 can be generated, for example, by amplifier 204 of FIG. 4. Amplified signal 512 corresponds to an amplified version of modulated signal 511, but converted from voltage domain to the current domain and with the addition of $V_{AmpOff}$. Thus, as shown, during PH1 and PH3 the amplitude (e.g., current) of signal 512 can be equal to $V_{Field}+V_{HPOff}+V_{AmpOff}$, and during PH2 and PH4 the amplitude can be equal to $-V_{Field}+V_{HPOff}+V_{AmpOff}$.

Comparator input signal 518 is a baseband signal having an amplitude (e.g., a current) equal to $V_{Field}+V_{Hys}$.

Figure 5B:
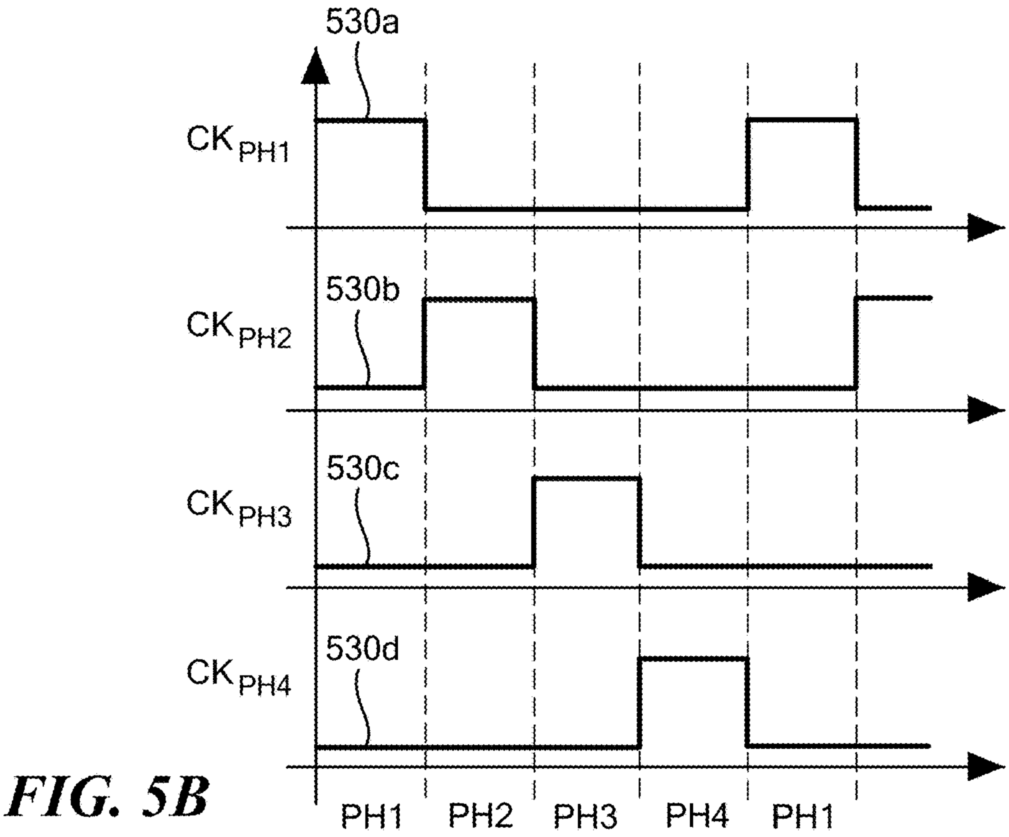
FIGS. 5B and 5C illustrate clock signal waveforms that may be used to control the sensor of FIG. 4.

FIG. 5B shows an example of clock signal waveforms that can be used to control the four-phase sensor implementation of FIG. 4. Four clock signals 530*a-d* ($CK_{PH1\text{-}4}$) are shown. During PH1, signal 530*a* ($CK_{PH1}$) can be high and signals 530*b-d* ($CK_{PH2\text{-}4}$) can be low. During PH2, signal 530*b* ($CK_{PH2}$) can be high and signals 530*a,c,d* ($CK_{PH1,3,4}$) can be low. During PH3, signal 530*c* ($CK_{PH3}$) can be high and signals 530*a,b,d* ($CK_{PH1,2,4}$) can be low. During PH4, signal 530*d* ($CK_{PH4}$) can be high and signals 530*a-c* ($CK_{PH1\text{-}c}$) can be low.

Figure 5C:
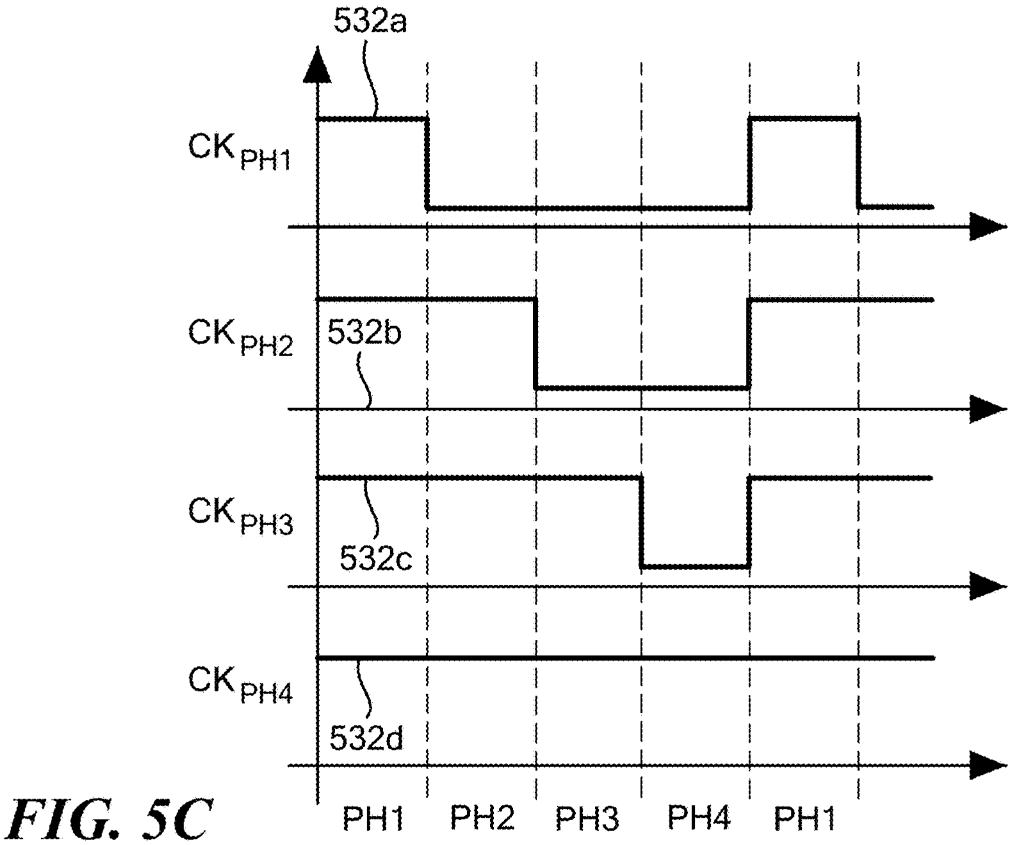

FIG. 5C shows another example of clock signal waveforms that can be used to control the four-phase sensor implementation of FIG. 4. Four clock signals 532*a-d* ($CK_{PH1\text{-}4}$) are shown. During PH1, all four signals 532*a-d* ($CK_{PH1\text{-}4}$). During PH2, signals 532*b-d* ($CK_{PH2\text{-}4}$) can be high and signal 532*a* ($CK_{PH1}$) can be low. During PH3, signals 532*c,d* ($CK_{PH3,4}$) can be high and signals 532*a,b* ($CK_{PH1,2}$) can be low. During PH4, signal 532*d* ($CK_{PH4}$) can be high and signals 532*a-c* ($CK_{PH1\text{-}c}$) can be low. The approach of FIG. 5C may be used to avoid the saturation of the comparator during startup and may be particularly useful for products that require a short awake time, as it may avoid having to wait for the comparator to slew back from saturation.

Figure 6:
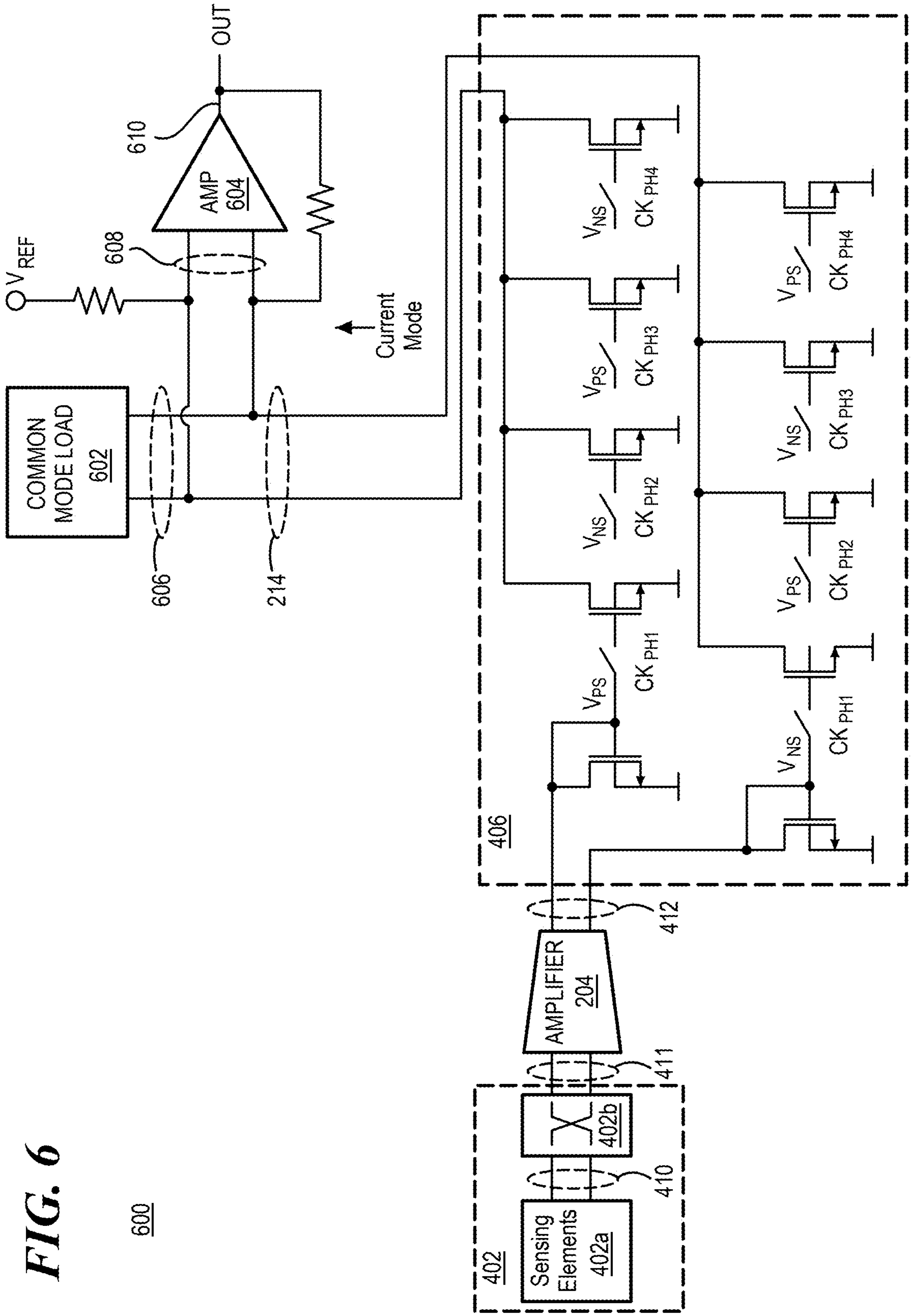
FIG. 6 is a schematic diagram showing a four-phase sensor implementation with linear output, according to some embodiments.

Turning to FIG. 6, the general concepts, structures, and techniques disclosed herein can also be applied to improve linear sensors.

FIG. 6 shows a four-phase implementation 600 of a magnetic field sensor with linear output. For brevity, like elements of FIGS. 2 and 4 are shown in FIG. 6 using like reference numerals and previously described features thereof may apply here as well. While a four-phase implementation is shown, the general concept can be applied to other numbers of phases, such as a two-phase implementation.

Implementation 600 includes a block 402 comprising one or more magnetic field sensing elements and circuitry configured to generate a magnetic field signal 410 responsive to a magnetic field, amplifier 204, an offset removal circuit 406, a common mode load circuit 602, and an output amplifier 604.

Common mode load circuit 602 can be configured to generate a common mode feedback (CMFB) signal 606 that is combined with conditioned signal (in the current domain) to provide an amplifier differential input signal 608 as input to amplifier 604. Circuit 602 can be provided to ensure a given voltage at both the positive and negative input terminals of amplifier 604.

Amplifier 604 can amplify signal 608 to generate sensor output signal 610, having an amplitude in linear proportion to an external magnetic field being sensed. Amplifier 604 can be provided as a transimpedance amplifier configured to convert current signal 214 to a single ended output voltage signal 610.

In contrast to discrete output implementation of FIG. 4 (which may be suitable for latch/switch applications), implementation 600 of FIG. 6 replaces the active load (e.g., current mirror 250) and comparator with circuitry 602, 604 to provide a linear sensor.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a digital signal processor (DSP), and/or in a discrete electronic circuit, which can be analog or digital. A processor or controller can include internal processors or modules that perform portions of the function, operation, or sequence of operations. Similarly, a module can include internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A sensor for performing signal conditioning in a current domain, the sensor comprising:

one or more sensing elements configured provide a magnetic field signal having a magnetic field component that varies in response to a magnetic field and an offset component contributed by the one or more sensing elements;

a modulation circuit having an input coupled to receive the magnetic field signal and an output to provide a modulated signal, the modulation circuit configured to modulate the magnetic field component of the magnetic field signal at a modulation frequency;

an amplifier having an input coupled to receive the modulated signal and an output to provide an amplified modulated signal, the amplified modulated signal having a magnetic field component that varies in response to the magnetic field, a first offset component contributed by the one or more sensing elements, and a second offset component contributed by the amplifier, the amplified modulated signal being a current domain signal with said components determining a current of the amplified modulated signal; and a sample and hold circuit having an input to receive the amplified modulated signal and an output to provide a conditioned signal, the conditioned signal being a current domain signal having a current that varies in response to the magnetic field signal and having substantially zero offset contribution from the one or more sensing elements and from the amplifier.

2. The sensor of claim 1 configured to operate in a plurality of phases including at least a first phase of operation and a second phase of operation different from the first phase of operation.

3. The sensor of claim 2 wherein:

in the first phase of operation, a magnitude of the modulated signal is substantially equal to the magnitude of the magnetic field signal; and in the second phase of operation, the magnitude of the modulated signal is substantially equal to a negative of the magnitude of the magnetic field signal.

4. The sensor of claim 2 wherein the sample and hold circuit comprises a plurality of switches operated according to one or more clock signals.

5. The sensor of claim 4 wherein at least one of the one or more clock signals alternates between two different phases of the plurality of phases.

6. The sensor of claim 4 wherein the sample and hold circuit comprises a plurality of memory devices each controllably connected to the amplifier output via one or more of the plurality of switches.

7. The sensor of claim 6 wherein different ones of the plurality of memory devices are arranged to sample and hold the amplified modulated signal during different phases of operation.

8. The sensor of claim 6 wherein the plurality of memory devices includes a plurality of transistors.

9. The sensor of claim 8 wherein the plurality of transistors includes one or more metal-oxide-semiconductor field-effect transistors (MOSTFETs).

10. The sensor of claim 8 wherein the plurality of transistors includes at least six transistors arranged to form at least two current mirrors.

11. The sensor of claim 7 wherein the sample and hold circuit comprises a node connected to outputs of one or more memory devices arranged to sample and hold the amplified modulated signal during the first phase of operation and to outputs of one or more memory devices arranged to sample and hold the amplified modulated signal during the second phase of operation.

12. The sensor of claim 1 wherein the one or more sensing elements comprise one or more Hall effect elements.

13. The sensor of claim 12 wherein the one or more Hall effect elements are provided as one or more spinning Hall plates.

14. The sensor of claim 1 wherein the magnetic field signal, the modulated signal, the amplified modulated signal, and the conditioned signal are all differential signals.

15. The sensor of claim 1 further comprising a comparator having an input coupled to receive the conditioned signal and an output to provide a comparator signal responsive to a comparison of the conditioned signal to a threshold value.

16. The sensor of claim 15 wherein the threshold value is zero.

17. The sensor of claim 15 further comprising a switch point circuit coupled between the sample and hold circuit and the comparator, the switch point circuit configured to generate a switch point signal and combine the switch point signal with the conditioned signal.

18. The sensor of claim 17 wherein the switch point circuit is configured to generate the switch point signal with hysteresis.

19. The sensor of claim 1 wherein the modulated signal is a voltage domain signal and the amplified signal is a current domain signal.

20. The sensor of claim 14 wherein the amplifier is an operational transconductance amplifier.

21. A sensor for performing signal conditioning in a current domain, the sensor comprising:

one or more sensing elements configured to generate a magnetic field signal having a magnetic field component that varies in response to a magnetic field and an offset component contributed by the one or more sensing elements;

a modulation circuit configured to modulate the magnetic field component of the magnetic field signal at a modulation frequency to provide a modulated signal;

an amplifier configured to receive the modulated signal and provide an amplified modulated signal, the amplified modulated signal being a current domain signal having a current responsive to at least the magnetic field and the offset contributed by the one or more sensing elements; and a sample and hold circuit configured to receive the amplified modulated signal and provide a conditioned signal, the conditioned signal being a current domain signal having a current that varies in response to the magnetic field signal and having substantially zero offset contribution from the one or more sensing elements and from the amplifier.

* * * * *